United States Patent
Law et al.

(10) Patent No.: US 8,169,067 B2
(45) Date of Patent: May 1, 2012

(54) LOW PROFILE BALL GRID ARRAY (BGA) PACKAGE WITH EXPOSED DIE AND METHOD OF MAKING SAME

(75) Inventors: Edward Law, Ladera Ranch, CA (US); Sam Ziqun Zhao, Irvine, CA (US); Rezaur Rahman Khan, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 1054 days.

(21) Appl. No.: 11/583,719

(22) Filed: Oct. 20, 2006

(65) Prior Publication Data

US 2008/0096312 A1   Apr. 24, 2008

(51) Int. Cl.
*H01L 23/48* (2006.01)
*H01L 23/06* (2006.01)
*H01L 23/22* (2006.01)
*H01L 23/24* (2006.01)

(52) U.S. Cl. . 257/690; 257/684; 257/687; 257/E23.033; 257/E23.021

(58) Field of Classification Search ........... 257/684, 257/687, 690; 29/832; 361/764, 783; 174/260; 438/125
See application file for complete search history.

(56) References Cited

U.S. PATENT DOCUMENTS

| | | | |
|---|---|---|---|
| 5,506,756 A | 4/1996 | Haley | |
| 5,696,666 A | 12/1997 | Miles et al. | |
| 5,894,108 A | 4/1999 | Mostafazadeh et al. | |
| 5,903,052 A * | 5/1999 | Chen et al. | 257/706 |
| 6,122,171 A * | 9/2000 | Akram et al. | 361/704 |
| 6,127,724 A * | 10/2000 | DiStefano | 257/675 |
| 6,221,694 B1 | 4/2001 | Bhatt et al. | |
| 6,395,578 B1 | 5/2002 | Shin et al. | |
| 6,501,184 B1 * | 12/2002 | Shin et al. | 257/778 |
| 6,825,108 B2 | 11/2004 | Khan et al. | |
| 6,830,955 B2 * | 12/2004 | Shin et al. | 438/106 |
| 6,848,912 B2 | 2/2005 | Zhang | |
| 6,853,070 B2 | 2/2005 | Khan et al. | |
| 6,861,750 B2 | 3/2005 | Zhao et al. | |
| 6,876,553 B2 | 4/2005 | ZHAO et al. | |
| 6,879,039 B2 | 4/2005 | Khan et al. | |

(Continued)

FOREIGN PATENT DOCUMENTS

CN   03238410   3/2003

(Continued)

OTHER PUBLICATIONS

European Search Report issued Feb. 29, 2008 for Appl. No. EP 07011819, 4 pages.

(Continued)

*Primary Examiner* — David Zarneke
(74) *Attorney, Agent, or Firm* — Sterne, Kessler, Goldstein & Fox P.L.L.C.

(57) ABSTRACT

Methods and apparatuses for improved thermal, electrical and/or mechanical performance in integrated circuit (IC) packages are described. An IC circuit package comprises a substrate having a central opening. An IC die, resides within the opening in the substrate. Wirebonds couples a plurality of bond pads on a top surface of the IC die to a plurality of bond fingers on a top surface the substrate. An encapsulating material encapsulates at least the IC die and the wirebonds such that at least a bottom surface of the IC die is left exposed. The encapsulating material suspends the die such that at least a portion of the die is held within the opening in the substrate.

14 Claims, 12 Drawing Sheets

U.S. PATENT DOCUMENTS

| | | | |
|---|---|---|---|
| 6,882,042 B2 | 4/2005 | Zhao et al. | |
| 6,887,741 B2 | 5/2005 | Zhao et al. | |
| 6,906,414 B2 | 6/2005 | Zhao et al. | |
| 6,936,922 B1* | 8/2005 | Park et al. | 257/737 |
| 6,989,593 B2 | 1/2006 | Khan et al. | |
| 6,995,448 B2* | 2/2006 | Lee et al. | 257/516 |
| 7,005,737 B2 | 2/2006 | Zhao et al. | |
| 7,026,719 B2* | 4/2006 | Wang | 257/777 |
| 7,038,312 B2 | 5/2006 | Khan et al. | |
| 7,078,806 B2 | 7/2006 | Khan et al. | |
| 7,094,060 B2 | 8/2006 | Zhang | |
| 7,102,225 B2 | 9/2006 | Khan et al. | |
| 7,126,210 B2* | 10/2006 | Chiu et al. | 257/667 |
| 7,132,744 B2 | 11/2006 | Zhao et al. | |
| 7,161,239 B2 | 1/2007 | Zhao et al. | |
| 7,168,957 B2 | 1/2007 | Zhang | |
| 7,196,415 B2 | 3/2007 | Zhong et al. | |
| 7,202,559 B2 | 4/2007 | Zhao et al. | |
| 7,227,256 B2 | 6/2007 | Zhao et al. | |
| 7,241,645 B2 | 7/2007 | Zhao et al. | |
| 7,245,500 B2 | 7/2007 | Khan et al. | |
| 7,259,448 B2 | 8/2007 | Zhang et al. | |
| 7,259,457 B2 | 8/2007 | Zhang et al. | |
| 7,271,479 B2 | 9/2007 | Zhao et al. | |
| 7,312,108 B2 | 12/2007 | Zhao et al. | |
| 7,326,061 B2 | 2/2008 | Zhang | |
| 7,411,281 B2* | 8/2008 | Zhang | 257/678 |
| 7,554,194 B2* | 6/2009 | Kelly et al. | 257/713 |
| 2002/0079572 A1 | 6/2002 | Khan et al. | |
| 2002/0135080 A1 | 9/2002 | Bai | |
| 2002/0190361 A1 | 12/2002 | Zhao et al. | |
| 2003/0146509 A1 | 8/2003 | Zhao et al. | |
| 2005/0012203 A1 | 1/2005 | Khan et al. | |
| 2005/0029657 A1 | 2/2005 | Khan et al. | |
| 2005/0035452 A1 | 2/2005 | Zhang et al. | |
| 2005/0077545 A1 | 4/2005 | Zhao et al. | |
| 2005/0127501 A1 | 6/2005 | Khan et al. | |
| 2005/0280127 A1 | 12/2005 | Zhao et al. | |
| 2005/0280139 A1 | 12/2005 | Zhao et al. | |
| 2005/0280141 A1 | 12/2005 | Zhang | |
| 2006/0065972 A1 | 3/2006 | Khan et al. | |
| 2006/0091542 A1 | 5/2006 | Zhao et al. | |
| 2007/0007644 A1 | 1/2007 | Zhao et al. | |
| 2007/0031996 A1* | 2/2007 | Chopin et al. | 438/122 |
| 2007/0045824 A1 | 3/2007 | Zhao et al. | |
| 2007/0108598 A1 | 5/2007 | Zhong et al. | |
| 2007/0200210 A1 | 8/2007 | Zhao et al. | |
| 2007/0267734 A1 | 11/2007 | Zhao et al. | |
| 2007/0267740 A1 | 11/2007 | Khan et al. | |
| 2007/0273023 A1 | 11/2007 | Zhao et al. | |
| 2007/0273049 A1 | 11/2007 | Khan et al. | |
| 2007/0290322 A1 | 12/2007 | Zhao et al. | |
| 2007/0290376 A1 | 12/2007 | Zhao et al. | |
| 2008/0006934 A1 | 1/2008 | Zhao et al. | |

FOREIGN PATENT DOCUMENTS

| | | |
|---|---|---|
| JP | 54-071986 | 6/1979 |
| JP | 63-283136 | 11/1988 |
| JP | 2000-58711 | 2/2000 |
| KR | 1999-025624 | 7/1998 |
| KR | 10-1999-0051154 | 7/1999 |
| KR | 1998-025624 | 8/1999 |
| WO | WO 03/017328 | 2/2003 |

OTHER PUBLICATIONS

Terry F. Hayden et al., "Thermal & Electrical Performance and Reliability Results for Cavity-Up Enhanced BGAs," IEEE Electrical Components and Technology Conference, 1999, pp. 638-644.

Bruce Freyman et al., "Overmolded Plastic Pad Array Carriers (OMPAC): A Low Cost, High Interconnect Density IC Packaging Solution for Consumer and Industrial Electronics," IEEE, 1991, pp. 176-182.

English-language Abstract of JP 2000058711, published Feb. 25, 2000, 1 page, printed from http://v3.espacenet.com.

English-language Abstract of Korean 1998-025624, published Jul. 15, 1998, 2 pages.

English-language Abstract of Korean 1998-025624, published Aug. 21, 1999, 2 pages.

English-language Abstract of Chinese 03238410, filed Mar. 14, 2003, 1 page.

English-language Abstract of Korean 10-1999-0051154, published Jul. 5, 1999, 1 page.

* cited by examiner

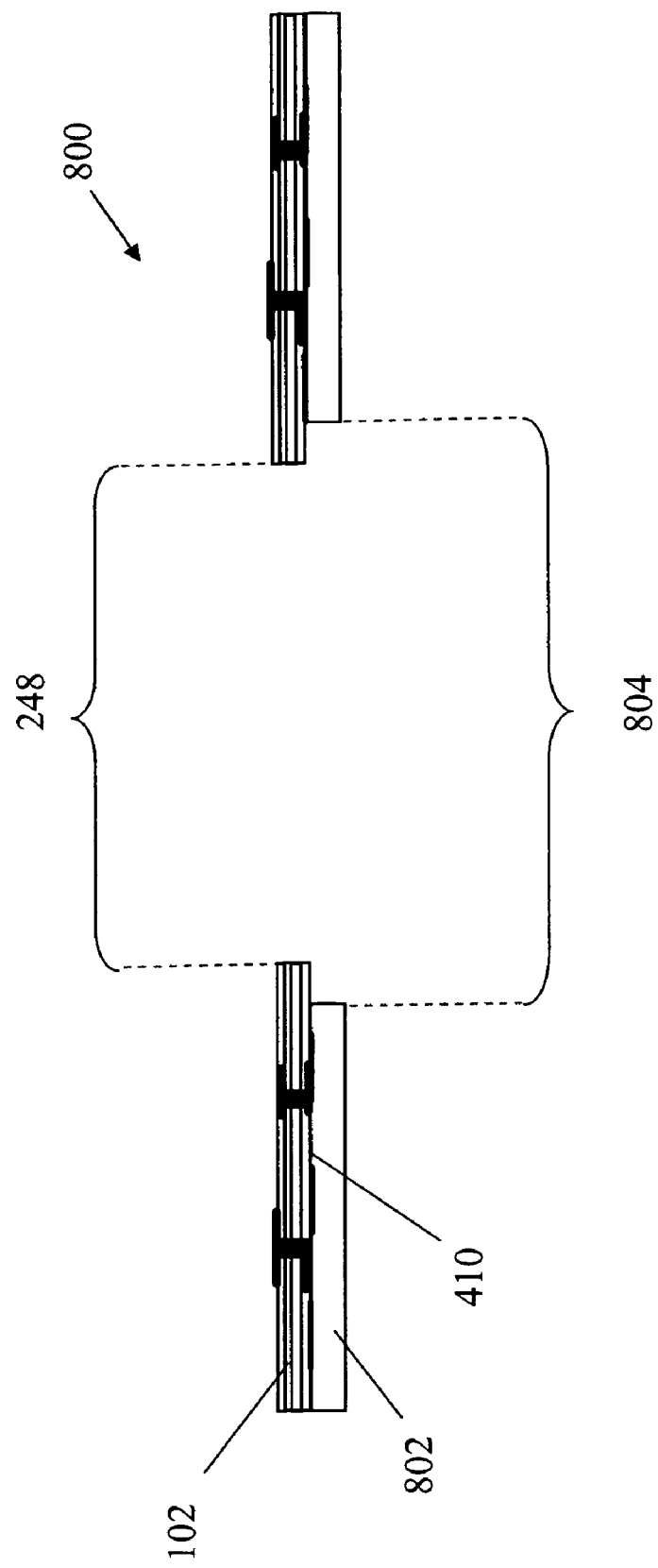

LOW PROFILE BALL GRID ARRAY (BGA) PACKAGE WITH EXPOSED DIE AND METHOD OF MAKING SAME

BACKGROUND OF THE INVENTION

1. Field of the Invention

The embodiments of the present invention relate to integrated circuit (IC) device packaging technology, and in particular, to ball grid array (BGA) packages having improved thermal and/or electrical characteristics.

2. Related Art

The die-up plastic ball grid array package was first introduced by Motorola and was called Overmolded Plastic Pad Array Carriers (OMPAC). For further detail on this package type, refer to "Overmolded Plastic Pad Array Carriers (OMPAC): A Low Cost, High Interconnect Density IC Packaging Solution for Consumer and Industrial Electronics," Electronic Components and Technology Conference, IEEE, pp. 176-182, 1991, which is incorporated by reference herein in its entirety. Commonly known as a "PBGA" package, the plastic ball grid array (PBGA) package features a plastic circuit board (substrate) typically made of Bismaleimide Triazine (BT) resins or FR4 materials.

FIG. 1 shows a conventional PBGA package 100. As shown in FIG. 1, PBGA package 100 has the following features:

a) An integrated circuit (IC) semiconductor die 118 is attached directly to the top surface of a printed circuit substrate 102.

b) Wirebonds 104 are used to electrically connect bond pads 112 of IC die 118 to a printed circuit on substrate 102.

c) A matrix of solder balls 110 is attached to the bottom surface of substrate 102.

d) A plastic molding compound 108 encapsulates both IC die 118 and wirebonds 104, and covers a portion of the top surface of substrate 102, for environmental protection. A periphery of the surface of substrate 102 around molding compound 108 is exposed (not covered by molding compound 108).

e) A die attach material 106 attaches IC die 118 to substrate 102.

Conventional BGA packages, such as shown in FIG. 1, have drawbacks, including: (1) a high package profile; (2) poor thermal performance; and (3) a long electrical interconnection path between the IC die and external pins of the package, and other drawbacks. Thus, what is needed are BGA packages with improved thermal performance, improved electrical performance, reduced package assembly yield loss, and improved package reliability.

SUMMARY OF THE INVENTION

Apparatuses, methods, and systems for improved integrated circuit packages are described. Embodiments of the present invention provide improved thermal, electrical, and/or mechanical performances for integrated circuit (IC) packages.

In an aspect of the present invention, an integrated circuit package includes a planar substrate having a plurality of contact pads on a top surface of the substrate. The contact pads are electrically connected through the substrate to a plurality of solder ball pads on a bottom surface of the substrate. An opening is present through the substrate. An IC semiconductor die is mounted in the opening of the substrate. A bottom surface of the IC die is configured to be attachable to a circuit board, such as a printed circuit board (PCB) or printed wiring board (PWB).

In an aspect, the IC die is not in direct contact with the substrate. Instead, a gap is present surrounding the IC die, between the IC die and the opening through the substrate.

In a further aspect, a wirebond connects a bond pad of the IC die to a contact pad of the substrate.

In a further aspect, an encapsulating material seals the die, the wirebond(s), covers at least a portion of the top surface of the substrate, and fills the gap. In a further aspect, the encapsulating material partially covers the bottom surface of the substrate around the periphery of the substrate opening.

In a still further aspect, a plurality of solder balls is attached to the solder ball pads on the bottom surface of the substrate, to connect the package to a circuit board when mounted thereto.

As mentioned above, the exposed bottom surface of the IC die is configured to be attached to a circuit board. In one aspect, the bottom surface of the IC die is directly connected to the circuit board when the package is mounted thereto. In another aspect, a second plurality of solder balls can be attached to the bottom surface of the IC die to couple the IC die to the circuit board when mounted thereto.

In another aspect of the present invention, a ball grid array package is assembled. A cover film is laminated to a substrate with an opening through the cover film and substrate. A carrier film is laminated on the cover film. An IC die is attached to the carrier film through the opening of the substrate and cover film. Bond pads on the IC die are connected with contact pads on the substrate. Ground/power pads are connected on the IC die by using a through-wafer-via. The IC die, wirebond, and opening in the substrate are encapsulated. The carrier and cover films are removed. A matrix of solder balls is attached to the bottom surface of the substrate.

These and other objects, advantages and features should become readily apparent in view of the following detailed description. Note that the Summary and Abstract sections may set forth one or more, but not all, exemplary embodiments of the present invention as contemplated by the inventors.

BRIEF DESCRIPTION OF THE FIGURES

The accompanying drawings, which are incorporated herein and form a part of the specification, illustrate the embodiments of the present invention and, together with the description, further serve to explain the principles of the embodiments and to enable a person skilled in the pertinent art to make and use the invention.

FIG. 8A-8D illustrate a BGA package at different phases of assembly, according to an example embodiment of the present invention.

Figure 1:
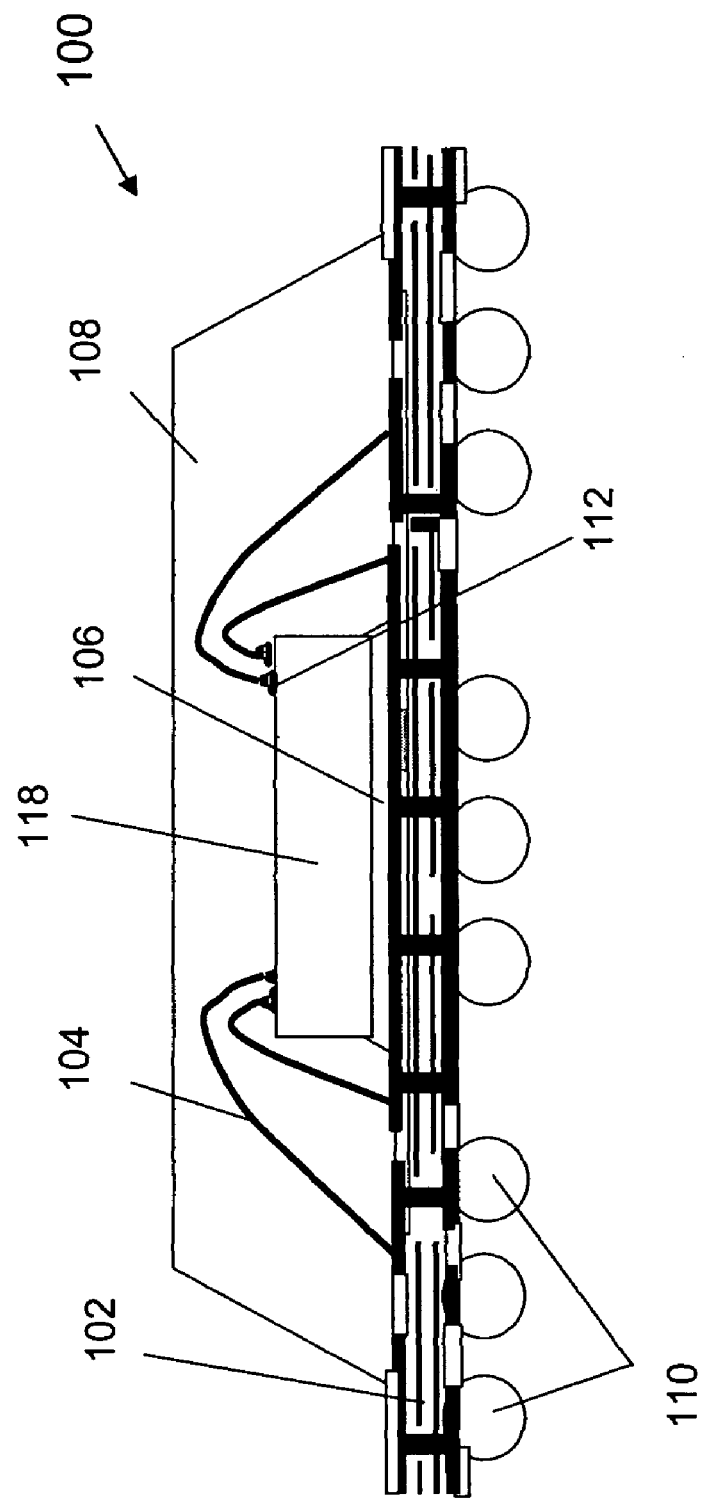
FIG. 1 shows a conventional plastic ball grid array (PBGA) package.

The embodiments of the present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The present specification discloses one or more embodiments that incorporate the features of the invention. The disclosed embodiments merely exemplify the invention. The scope of the invention is not limited to the disclosed embodiments. The invention is defined by the claims appended hereto.

Furthermore, it should be understood that spatial descriptions (e.g., "above", "below", "left," "right," "up," "down", "top", "bottom", etc.) used herein are for purposes of illustration only, and that practical implementations of the structures described herein can be spatially arranged in any orientation or manner.

Overview

The embodiments of the present invention described herein improve the thermal, electrical and mechanical performances of wire-bond die-up array package (BGA, PGA, LGA, etc.) by exposing a bottom surface of an IC die through a window opening in a central region of a substrate. The present invention is applicable to all types of BGA substrates, including ceramic, plastic, and tape (flex) BGA packages.

Numerous embodiments of the present invention are presented herein. For example, in an embodiment, the IC die is suspended or held within a central opening window of a substrate in an IC package. A bottom surface of the die is positioned underneath the top surface of the substrate. Because the IC die is held within the opening window, the mold thickness can be reduced substantially by lowering an elevation of a top surface of the die. For example, the IC die can be suspended such that a bottom surface of the die protrudes below a bottom surface of the substrate. Additionally, the bottom surface of the IC die can be configured for thermal contact with a circuit board, such as a printed wire board (PWB) or a printed circuit board (PCB), on which the package is mounted. Such direct thermal connection between the backside of the IC die and top surface of the circuit board provides a conductive thermal path from the IC die to the circuit board for heat dissipation. Because the height of the top surface of the IC die is reduced to be closer to the top surface of the substrate, a length of wirebonds coupled between the die and substrate can be reduced.

In an embodiment of the present invention, an opening in the substrate is provided. The semiconductor die is at least partially encapsulated in an encapsulating material. The encapsulating material also encapsulates at least a portion of the top surface of the substrate. A portion of the encapsulating material is exposed at both top and bottom sides of the substrate. A plurality of solder balls is located on the bottom surface of the substrate surrounding the portion of the encapsulating material that is exposed in the central region of the substrate. The bottom surface of the die is exposed for thermal contact with the circuit board on which the package is to be mounted. The exposed IC die bottom surface can be further coated with metal or metal alloy to facilitate direct soldering to a circuit board.

Because the IC die is held within the opening of the substrate, the total height of the package can be substantially reduced with a reduced mold thickness above the substrate. A Package junction-to-board thermal resistance is substantially reduced by coupling (e.g. soldering) the bottom surface of the IC die to a circuit board on which the package is mounted. A wirebond length is also reduced because of a reduction of spatial distance between bond pads on the IC die and bond fingers on the substrate as a result of placing the IC die into the opening of the substrate.

Integrated Circuit Package Technology

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover the bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., Ball Grid Array Technology, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex"). For examples of different types of BGA packages, refer to Hayden, T. F., et al., Thermal & Electrical Performance and Reliability Results for Cavity-Up Enhanced BGAs, Electronic Components and Technology Conference, IEEE, pp. 638-644 (1999), which is incorporated herein by reference. A few example conventional BGA packages are described in the remainder of this section.

Figure 2:
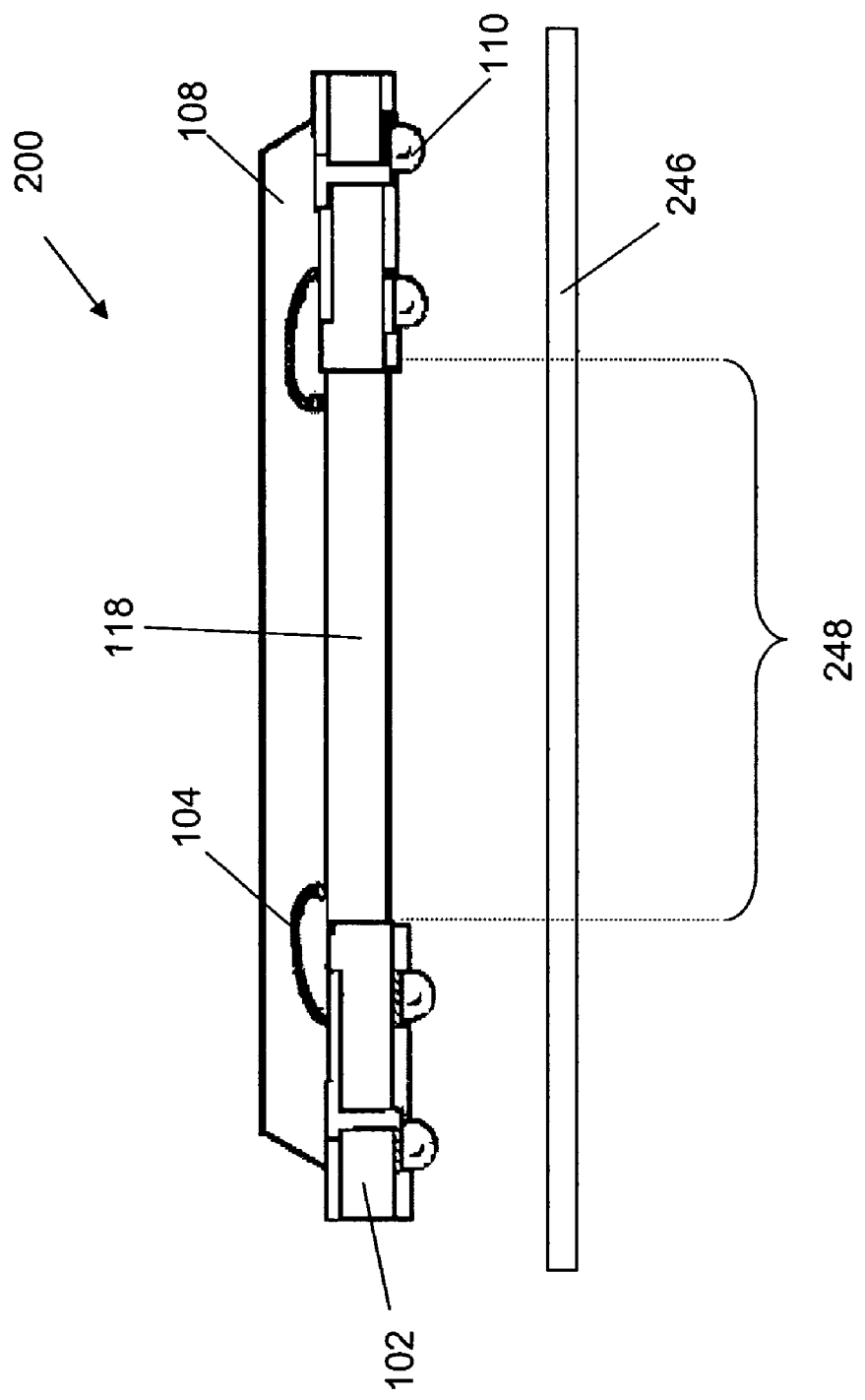
FIG. 2 shows a BGA package with a through-cavity opening in the substrate for mounting an exposed die.

For example, FIG. 2 shows a BGA package 200 including a through-cavity opening 248 in substrate 102 for receiving a semiconductor die 118. For further detail on package 200, refer to U.S. Pat. No. 5,696,666 titled "Low Profile Exposed Die Chip Carrier Package," which is incorporated by reference herein in its entirety. Package 200 in FIG. 2 reduces package height and improves resistance to moisture sensitivity. Opening 248 has a perimeter that is similar in shape and size to the perimeter of die 118. The rectangular-shaped opening 248 is located near a center of substrate 102, and extends completely through substrate 102. Die 118 is seated in opening 248 such that a bottom surface of IC die 118 is substantially coplanar with a bottom surface of substrate 102. Thus, a typical die-to-substrate interface (where die 118 would be mounted to substrate 102 as in FIG. 1) is eliminated, leaving the bottom surface of IC die 118 exposed.

An transfermolded or glob top material 108 encapsulates the top surface of IC die 118 and portions of the top surface of substrate 102. IC die 118 is held in place by direct and intimate contact between the perimeter of through-cavity opening 248 and the perimeter of IC die 118, and by encapsulant-to-die adhesion. The top surface of IC die 118 is at approximately the same level as the top surface of substrate 102. Because the bottom surface of IC die 118 is on the same plane as the bottom surface of substrate 102, exposed die 118 cannot conduct heat directly into a circuit board 246 on which package 200 is mounted. Additionally, edge walls of substrate 102 directly contact the perimeter of IC die 118. A difference in the coefficient of thermal expansion between substrate 102 and IC die 118 causes thermal stress at the contact interface and can result in cracking of IC die 118 and delamination at the interface.

Another conventional die-up BGA design (not shown) uses a tape substrate, where the bottom surface of the IC die is exposed through the bottom surface of the tape substrate, and the bottom surface of the IC die is substantially coplanar with the bottom surface of the tape substrate. For further detail on this package, refer to U.S. Pat. No. 5,506,756 titled "Tape BGA Package Die-up/Die Down," which is incorporated by reference herein in its entirety. Solder balls are attached to the bottom surface of the exposed IC die to provide additional interconnection between the IC die and the PWB. In another implementation, the active surface of the IC die faces downward ("die-down") and the bottom surface of the IC die is exposed for a external heat sink attachment to the die from the top side of the package. Because the tape substrate is substantially thinner than the IC die, the top surface of the IC die is well above the top surface of the substrate and the reduction of the package's height is insignificant when the bottom surface of the IC die and the bottom surface of the tape substrate are aligned. Because of the difference in the coefficient of thermal expansion between the IC die and because of the relative softness of tape substrate, the substrate can easily deform from thermal expansion or contraction during the package assembly process. Such a situation can also cause warping in the substrate, and stress at the contact interface around the perimeter of the IC die. Still further, cracks and delamination can originate at this interface and can grow along the perimeter of the IC die.

In the above described packages, both the resin substrate and the plastic molding compound materials have low thermal conductivity values (around 0.19~0.3 W/m° C. for BT or FR4 type substrates and 0.2~0.9 W/m° C. for molding compound). Since the IC die is entirely surrounded by materials with poor heat conduction properties, the heat generated by the IC die is trapped within the PBGA package. The temperature of the IC die must rise high above the environment's temperature to release the trapped heat.

Figure 3:
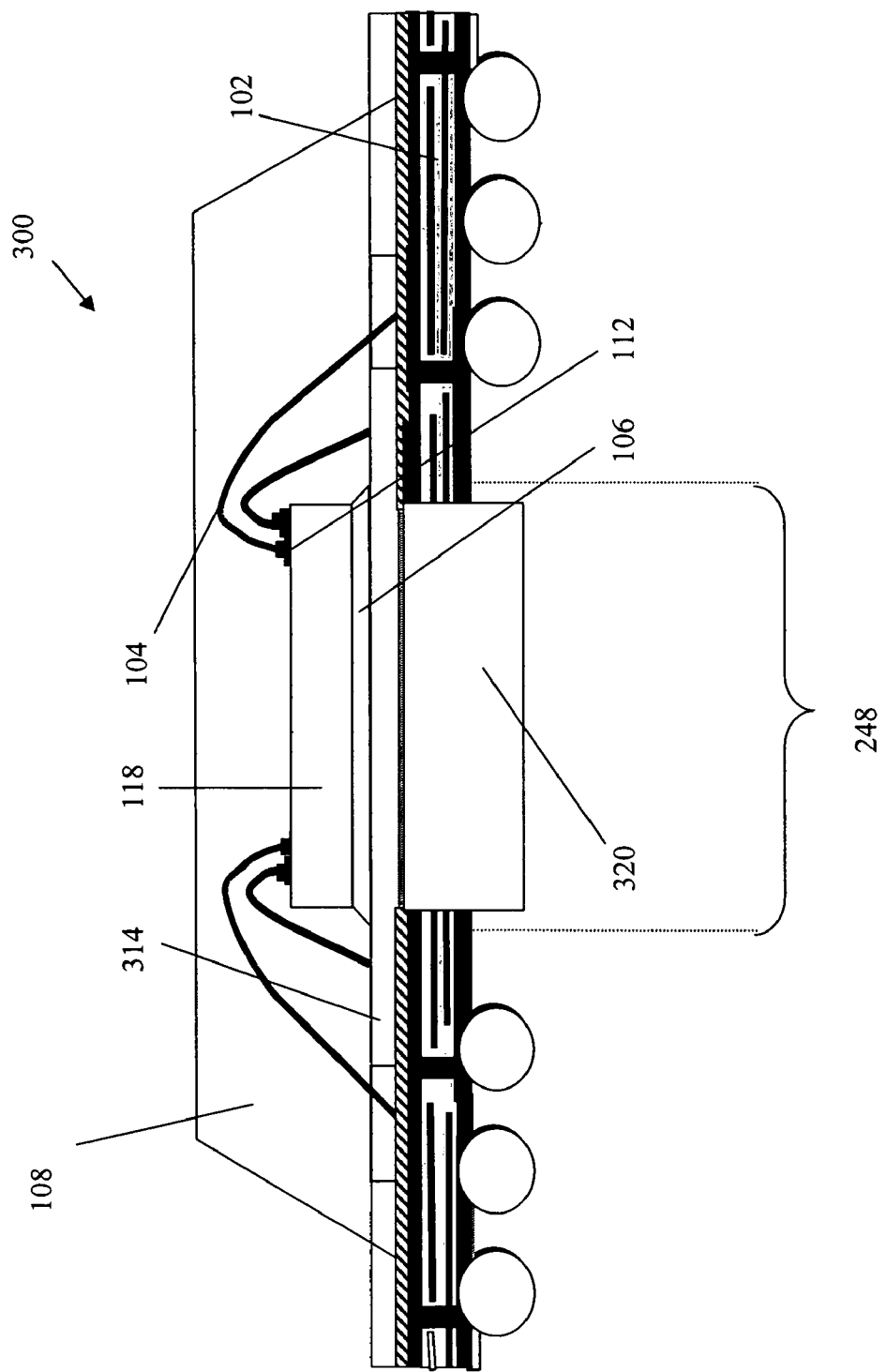
FIG. 3 shows a thermally and electrically enhanced die-up BGA with a stiffener/interposer and a thermal/electrical connector.

FIG. 3 shows a die-up ball grid array (BGA) package 300 using a copper stiffener/interposer 314 to increase heat transfer from IC die 118 to the rest of package 300. For further detail on package 300, refer to U.S. Patent Appl. Publ. No. 2002/0079562, which is incorporated by reference herein in its entirety; In package 300, the bottom surface of IC die 118 (opposite the integrated circuit on the top surface) is directly attached to a flat stiffener 314. The other surface of stiffener 314 is attached to substrate 102, which in FIG. 3 is made of an organic material such as a polyimide tape or resin epoxy substrate (BT, for example). Stiffener 314, which may be copper, has a larger surface area than IC die 118 and promotes heat dissipation into the surrounding materials. Connecting the ground pads on IC die 118 to stiffener 314 further reduces package-ground inductance.

A thermally conducting body 320 is attached to stiffener 314 through window opening 248 in substrate 102. Thermally connecting body 320 provides a heat dissipation path from the bottom surface of IC die 118 to the PWB (through stiffener 314), on which package 300 is mounted. However, a height or thickness of package 300 is increased due to the requirement of direct IC die attachment on stiffener/interposer 314 that is stacked on package substrate 102.

Embodiments of the present invention overcome the limitations described above. Example embodiments of the present invention are described in detail below.

Embodiments According to the Present Invention

Further details of structural and operational implementations of IC packages of the present invention are described in the following sections. These structural and operational implementations are described herein for illustrative purposes, and are not limiting. For instance, the present invention as described herein may be implemented in other IC package types, including land grid array (LGA) and pin grid array (PGA) packages, including any of the packages described above. Furthermore, each of the embodiments presented below are applicable to tape substrate BGA packages, plastic substrate BGA packages, ceramic substrate BGA packages, and other substrate types. The description below is adaptable to these and other package types, as would be understood to persons skilled in the relevant art(s) from the teachings herein.

Features of each of the embodiments presented below may be incorporated into IC packages independently, or may be combined in any manner with the other features described herein, as would be apparent to persons skilled in the relevant art(s) from the teachings herein.

Figure 4:
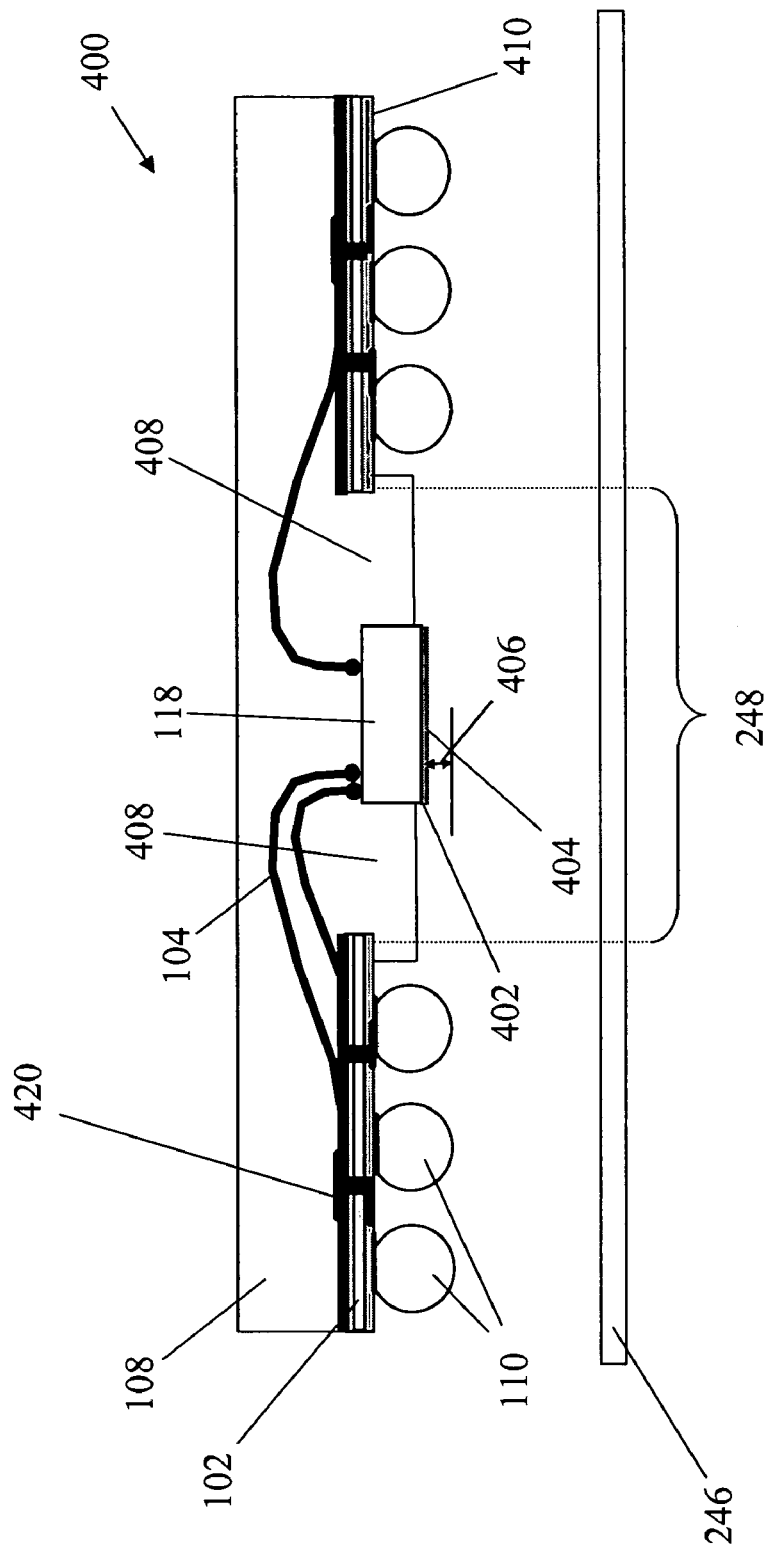
FIG. 4 shows a BGA package with an integrated circuit (IC) die held in a central window opening of a package substrate, according to an example embodiment of the present invention.

FIG. 4 shows an example of a die-up BGA package 400, according to an embodiment of the present invention. Package 400 includes a substrate 102 having an opening 248, an IC die 118, a plurality of solder balls 110, an encapsulating material 108, contact pads 420, and a plurality of wirebonds 104. In embodiments, active integrated circuits of IC die 118 are on a top surface of IC die 118 and are sealed by encapsulating material 108.

Substrate 102 can be organic (BT, FR4, etc.), ceramic, glass, tape, and/or made from other dielectric materials. Furthermore, substrate 102 may have one or more conductive layers, including features such as contact pads, bond fingers, traces, conductive planes, etc., for transmission of electrical signals, attachment of wirebonds, solder balls, etc., to enhance mounting of electrical components, for power/ground planes, etc. Vias or other electrically conductive features may be used to electrically couple conductive features through substrate 102.

Opening 248 is open at the top and bottom surfaces of substrate 102. According to an embodiment of the present invention, IC die 118 is held in opening 248 by encapsulating material 108. A bottom surface 402 of IC die 118 is exposed (not covered with encapsulation material 108). Bottom surface 402 may be coated with a metallization layer 404 comprised of metal or alloy to enhance connection to a circuit board 246. Circuit board 246 may be a printed circuit board (PCB), a printed wire board (PWB), or any other type of circuit board.

In an embodiment, coupling the bottom surface of 402 directly to the surface of circuit board 246 through the use of metallization layer 404 provides enhanced heat dissipation by providing a direct thermal path from IC die 118 to circuit board 246, when package 400 is mounted thereto.

A distance between bottom surface 402 of die 118 and the surface of circuit board 246 is referred to as a standoff height 406. Standoff height 406 of IC die 118 is designed such that contact is made between bottom surface 402 and circuit board 246 after the collapse of solder balls 110 (during reflow surface mount assembly) on substrate 102. Standoff height 406 is configured based on the solder ball size used. For example, a typical standoff height 406 is between 0.05 mm and 0.3 mm for packages with solder balls having an initial diameter of 0.6 mm before attachment to package substrate 102. Standoff height 406 may slightly exceed the above range for solder balls with a diameter of 0.6 mm. However, if standoff height 406 is too small, one or more of solder balls 110 may not make contact with a land pad on circuit board 246 after reflow surface mount, causing an open connection. If standoff height 406 is too large, bottom surface 402 may not make contact with circuit board 246 due to the limited range over which solder balls 110 can collapse during reflow surface mount.

Die 118 is held in position by encapsulating material 108. Encapsulating material 108 seals opening 248 in substrate 102, and covers die 118 and wirebonds 104 for environmental protection and structural integrity. Furthermore, encapsulating material 108 also covers at least a portion of bottom surface 410 of substrate 102 surrounding opening 248. Encapsulating material 108 may be any type of encapsulating material, such as a molding compound, epoxy, etc.

In embodiments, IC die 118 does not make direct contact with substrate 102, but instead is separated by a gap 408. When body IC die 118 does not make contact with substrate 102, space is provided on a bottom surface 410 of substrate 102 for solder balls. Furthermore, unwanted "interface triple-lines" described above are reduced or eliminated. Still further, bottom surface 402 provides an efficient thermal path for spreading heat.

Figure 5A:
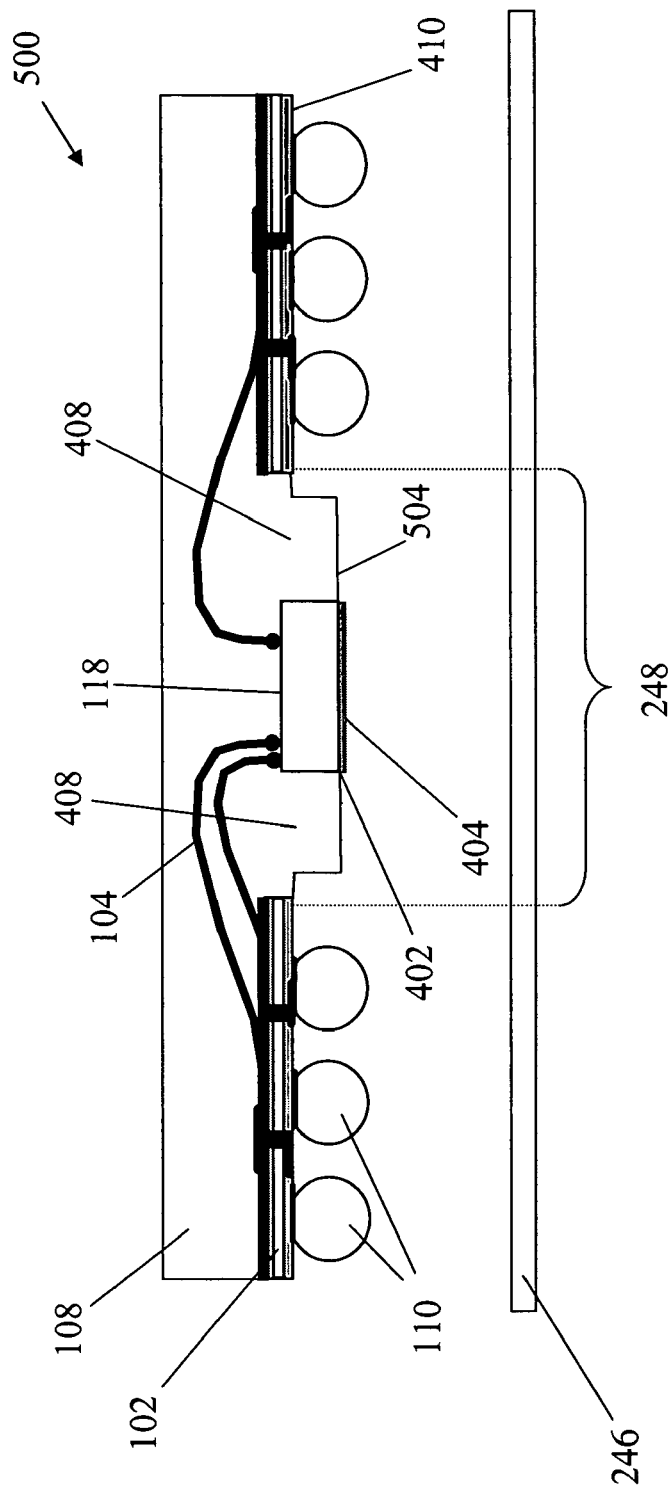
FIGS. 5A and 5B show BGA packages with IC dies held in a central window opening, where the side walls of the IC die are respectively completely and partially covered, according to example embodiments of the present invention.

FIG. 5A shows an example die-up BGA package 500, according to another embodiment of the present invention. Package 500 is generally similar to package 400 of FIG. 4 with some differences described as follows. Package 500 includes an IC die 118 held into opening 248 as in package 400, but encapsulating material 108 has a bottom surface 504 that is flush with bottom surface 410 of substrate 102. In this embodiment, only bottom surface 402 of IC die 118 is exposed and all other surfaces of IC die 118 are covered by encapsulating material 108.

Figure 5B:
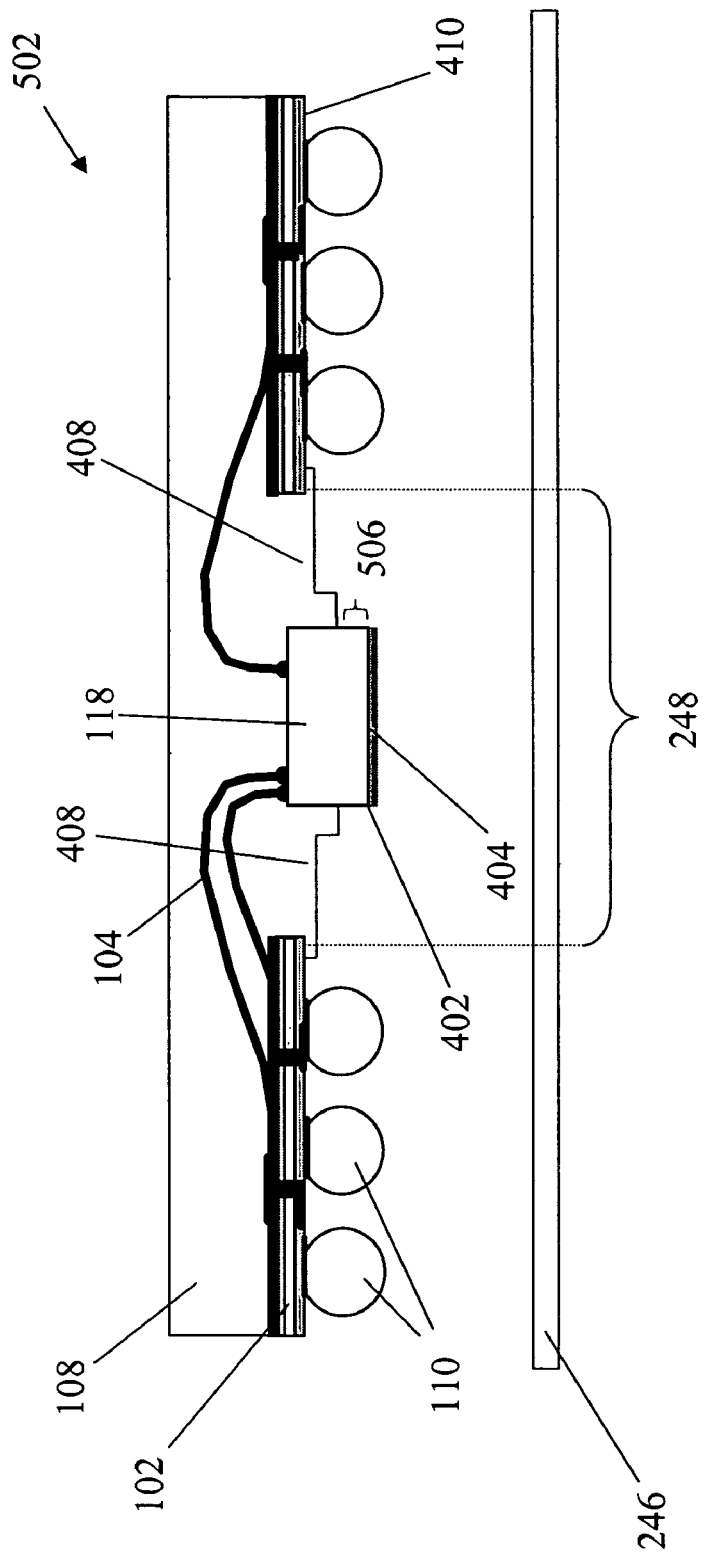

FIG. 5B shows a package 502 which is an alternate configuration of BGA package 500 in FIG. 5A. Package 502 is generally similar to package 500 of FIG. 5A, but instead of only leaving bottom surface 402 exposed, in package 502, encapsulating material 108 also does not cover a portion 506 of a perimeter of IC die 118. Furthermore, in package 502, encapsulating material 108 covers a portion of bottom surface 410 of substrate 102 surrounding opening 248.

Figure 6:
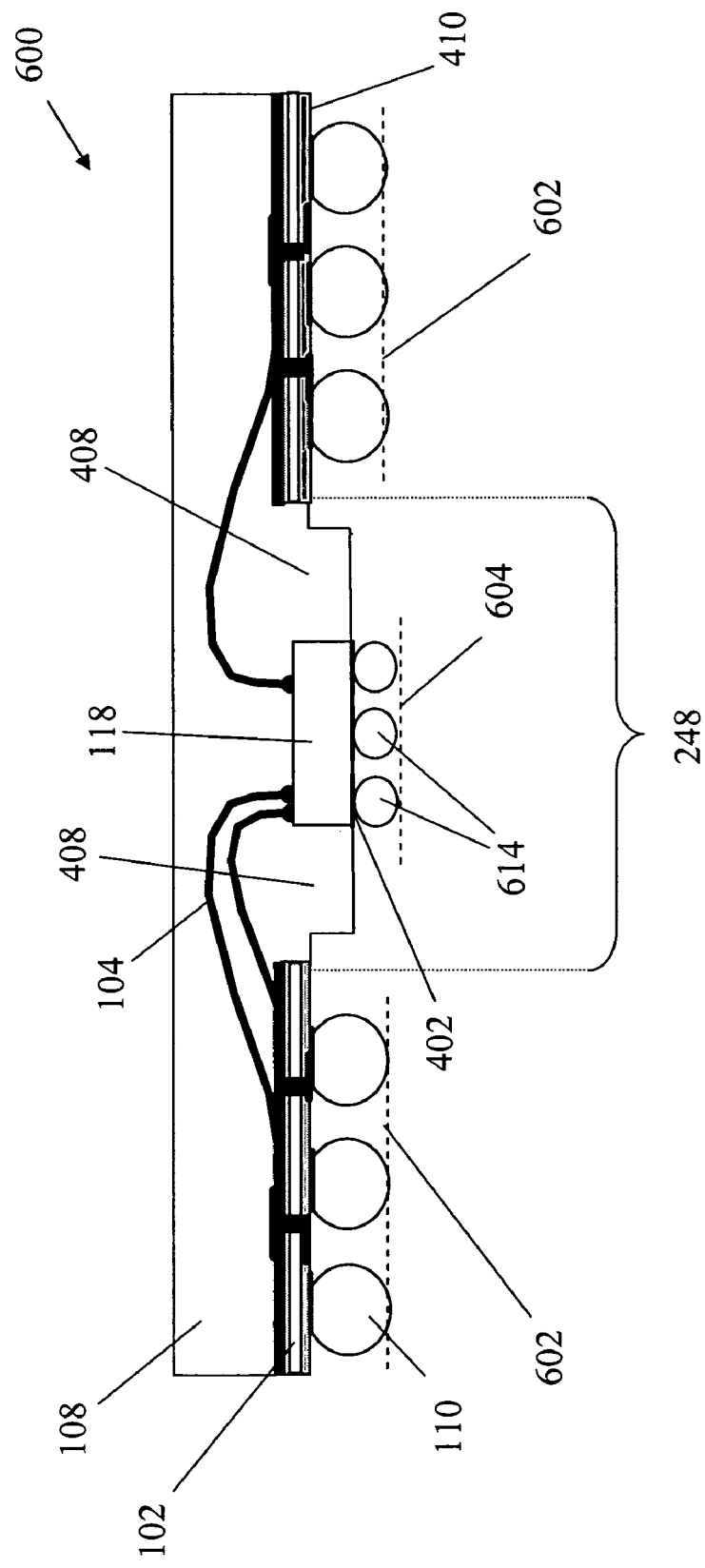
FIG. 6 shows a BGA package with a matrix of mini-solder balls attached to a backside of the IC die, according to an example embodiment of the present invention.

FIG. 6 shows a die-up BGA package 600, according to another embodiment of the present invention. Package 600 is substantially similar to package 500 of FIG. 5A, with some differences as follows. Package 600 has a plurality of mini solder balls 614 attached to bottom surface 402 of die 118. In embodiments, solder balls 614 are used for ground or power connections between IC die 118 and a circuit board that mounts package 600. Each mini solder ball of mini solder balls 614 is smaller in diameter than a diameter of solder balls 110 attached to bottom surface 410 of substrate 102. Mini solder balls 614 also provide a heat conduction path from IC die 118 to the circuit board. In an embodiment, a bottom of each solder ball of mini solder balls 614 that connects to the circuit board is co-planar with a bottom of each solder ball of solder balls 110 that connects to the circuit board. In other embodiments, a sitting plane 604 for mini solder balls 614 can be slightly closer to IC die 118 than the sitting plane 602 of solder balls 110 because a collapse of solder balls 110 is typically greater than that of mini solder balls 614, which lowers mini solder balls 614, and allows mini solder balls 614 to contact the circuit board during the reflow process for surface mounting.

For example, in embodiments, sitting plane 604 of mini solder balls 614 may be 0.3 mm above sitting plane 602 of solder balls 110, because solder balls 110 have diameters of 0.6 mm or larger. The sitting plane for mini solder balls 614 can be slightly farther away from IC die 118 than the sitting plane of solder balls 110 as long as solder balls 110 can make sufficient contact with solder ball pads on the circuit board after collapse of mini solder balls 614 during reflow surface mount.

In embodiments, mini solder balls 614 are attached to a plurality of contact sites on bottom surface 402 that are defined with a selective metal coating. The metal coating on IC die 118 promotes solder wetting and helps to define the position of mini solder balls 614 on IC die 118.

Figure 7:
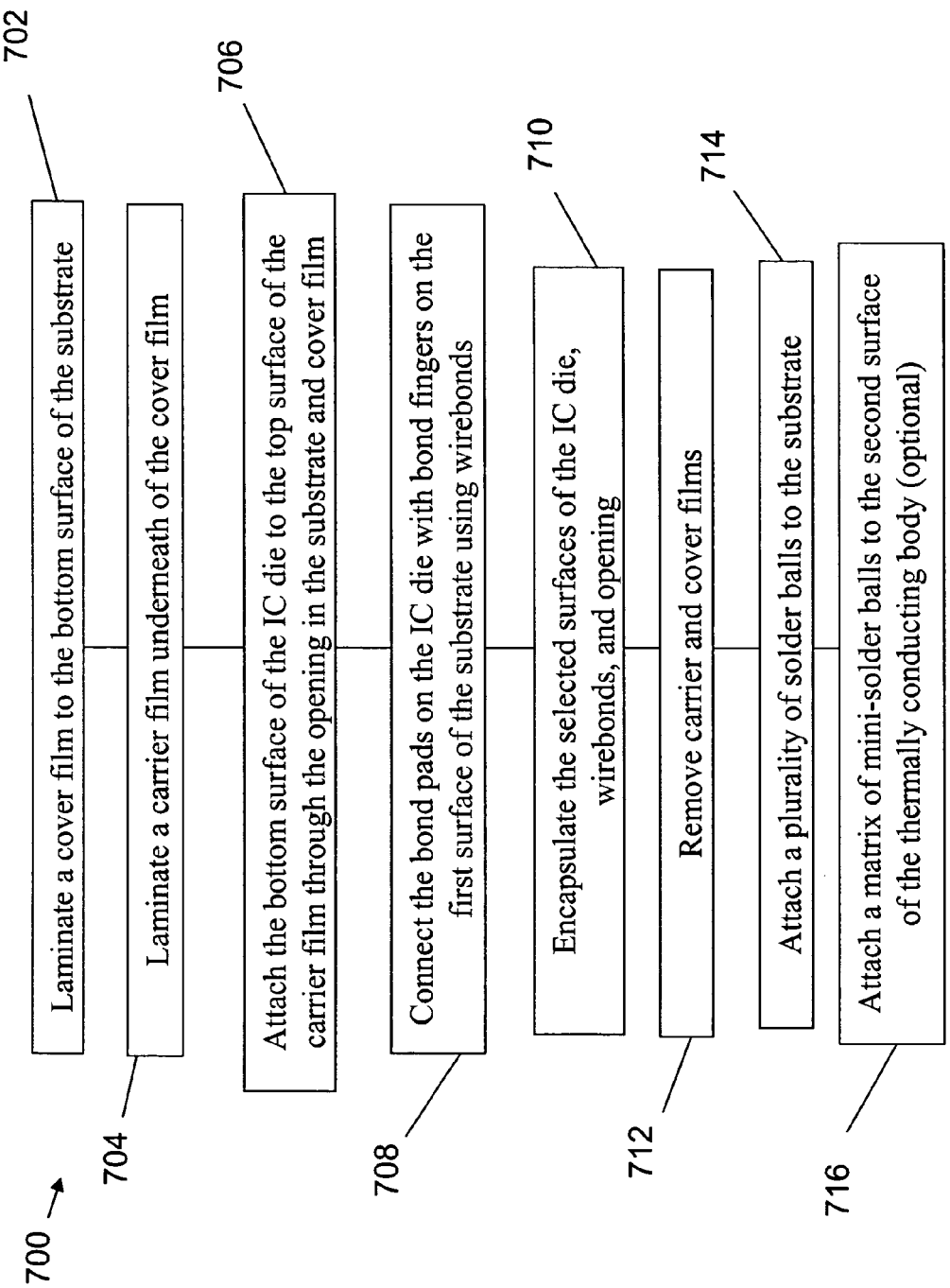
FIG. 7 shows a flowchart of the assembly steps for a BGA package, according to an example embodiment of the present invention.

FIG. 7 shows a flowchart 700 providing steps to assemble example die-up BGA packages, according to embodiments of the present invention. For example, flowchart 700 may be used to assemble the packages shown in FIGS. 4, 5A, 5B, and 6 described above. FIGS. 8A-8D illustrate assembly stages in a process for assembling an example die-up an IC package according to flowchart 700, and are referred to in the description below regarding flowchart 700, for illustrative purposes. As would be understood by someone skilled in the art, the steps shown in flowchart do not have to occur in the order listed.

Flowchart 700 begins in step 702. In step 702, a cover film is laminated at the bottom surface of a substrate. For example, in a partial package 800 as shown in FIG. 8A, a cover film 802 is laminated at bottom surface 410 of substrate 102. Cover film 802 also has a central window opening 804 that may be larger than, smaller than, or the same size as opening 248 in substrate 102. Opening 804 of cover film 802 overlaps with opening 248 of substrate 102. Cover film 802 provides a seal underneath substrate 102 during the encapsulation process of package assembly.

Figure 8B:
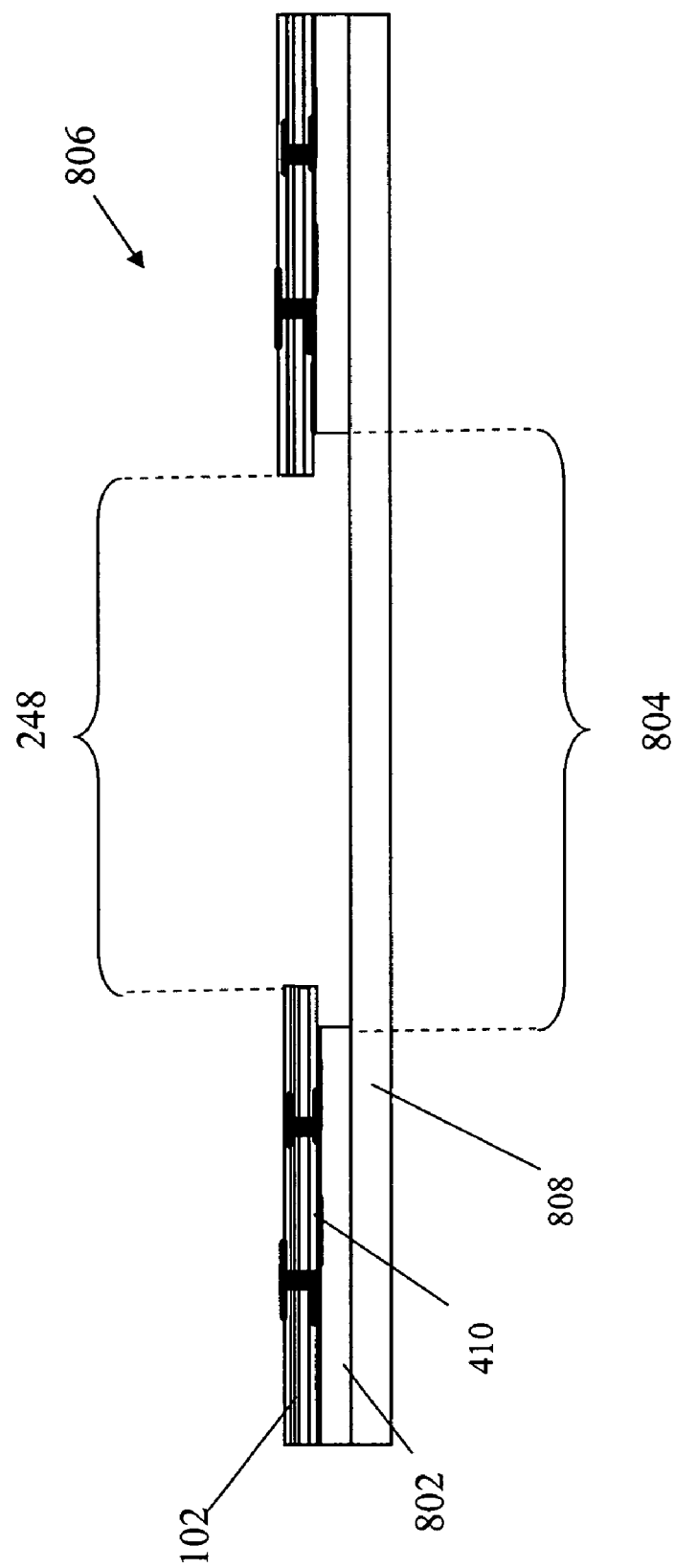

In step 704, a carrier film is laminated underneath the cover film. For example, in a partial package 806 as shown in FIG. 8B, a carrier film 808 is laminated underneath cover film 802. Carrier film 808 covers opening 804 in cover film 802. Carrier film 808 provides a seal through window opening 804 of a bottom surface of cover film 802 for application of an encapsulating material. Carrier film 808 also provides temporary support and fixation of the IC die position for a wirebond process. To this end, the top of carrier film 808 may have an adhesive coating layer to hold a heat spreader (when present) and/or the IC die in place during a wirebond and mold encapsulation process. Furthermore, carrier film 808 may be planar (as shown in FIG. 8B), or may have a central cavity or protruding portion to lower or raise die 118 (when attached thereto in step 706) as desired, to change a plane of die 118 relative to substrate 102.

In step 706, a bottom surface of the IC die is attached to the carrier film through the opening of the substrate and cover film. For example, in a partial package 810 as shown in FIG.

8C, IC die 118 is attached to a surface of carrier film 808 through central openings 248 and 804 of substrate 102 and cover film 802, respectively.

Figure 8C:
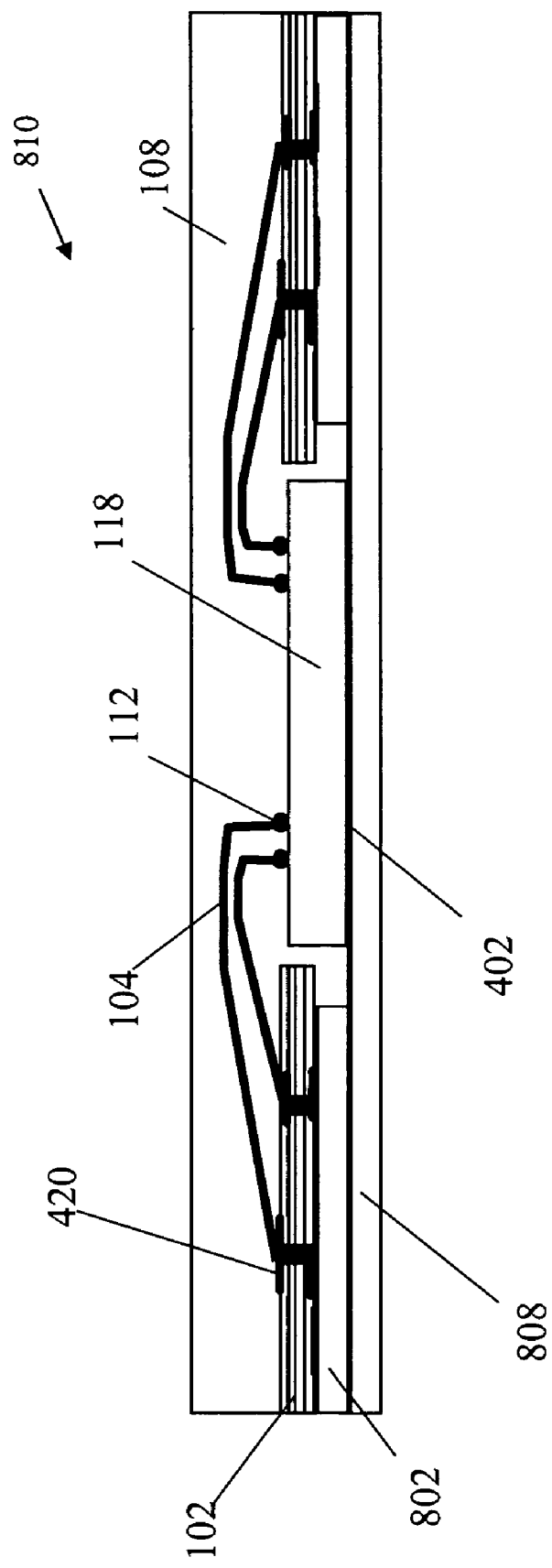
Figure 8D:
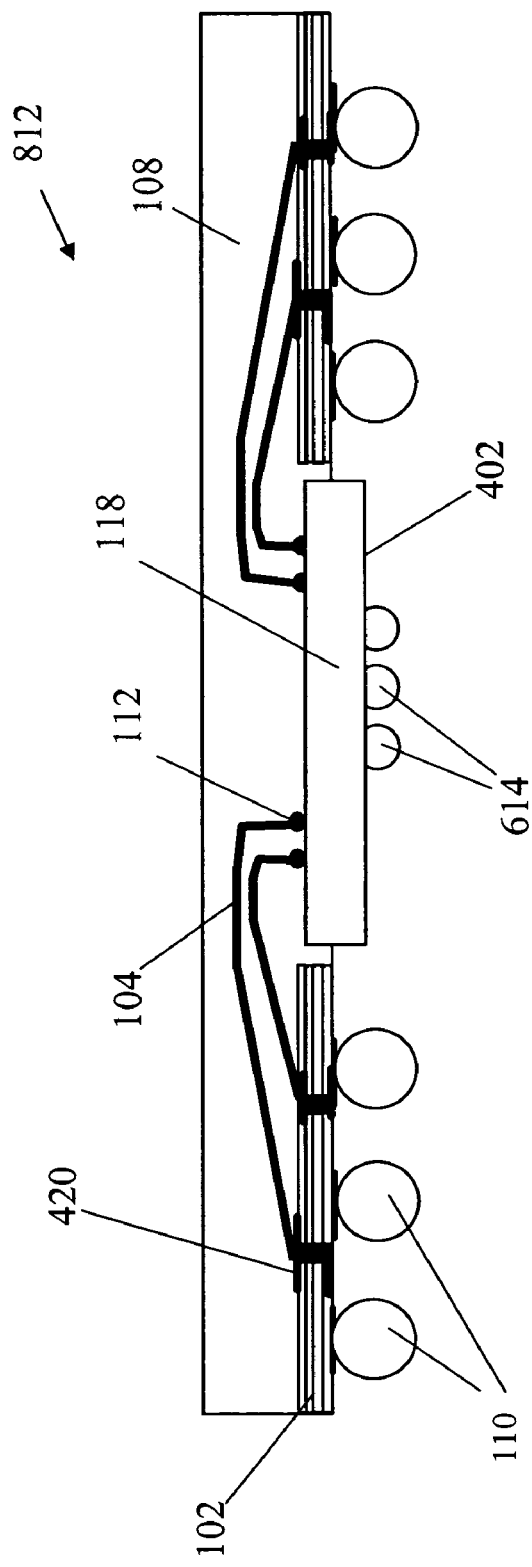

In step 708, bond pads on the IC die are connected with contact pads on a top surface of the substrate using one or more wirebonds. For example, in a partial package 810 as shown in FIG. 8C, bond pads 112 on IC die 118 are connected with contact pads 420 on top of substrate 102 using wirebonds 104.

In step 710, the IC die, the wirebonds, and the opening are encapsulated in the substrate. For example, as shown in package 810 of FIG. 8C, IC die 118, wirebonds 104, and opening 248 are encapsulated by encapsulating material 108. Die 118 is encapsulated in openings 248 and 804 on carrier film 808. Carrier film 808 is supported during the wirebond process using a rigid platform. Alternatively, a reusable rigid supporting plate may be attached to the bottom surface of carrier film 808 to provide support for IC die 118 and substrate 102 during the wirebond process. In an embodiment wirebonds 104 and the active surface of IC die 118 are encapsulated from the environment-using a molding process.

In step 712, the carrier and cover films are removed. For example, shown for a package 812 in FIG. 8D, carrier film 808 and cover film 802 are removed, leaving die 118 suspended in opening 248 of substrate 102 by encapsulating material 108. Furthermore, bottom surface 402 of die 118 is exposed.

In step 714, a plurality of solder balls is attached to the package substrate. For example, as shown for in package 812 of in FIG. 8D, plurality of solder balls 110 is attached to package substrate 102.

In an optional step 716 (e.g., to construct package 600 shown in FIG. 6), a plurality of mini solder balls can be attached to the IC die. For example, as shown for package 812 shown in FIG. 8D, plurality of mini solder balls 614 is attached to IC die 118. Mini solder balls 614 can be used to couple die 118 to a circuit board to which package 812 is mounted. Alternately, surface 402 of die 118 can be plated or not plated and surface 402 of die 118 can be directly attach to a circuit board to which package 812 is mounted.

Example Advantages

Embodiments of the present invention provide many advantages over conventional BGA packages, including those described above with respect to FIGS. 1-3. Some of these advantages are described below. Each advantage described below does not necessarily apply to each embodiment described herein. Furthermore, the advantages provided by embodiments of the present invention are not necessarily limited to those described below.

(1) Placing the IC die in an opening in the substrate, thereby reducing the length of wirebonds necessary to connect the IC die to the substrate, substantially reduces the height of the package profile and increases reliability of the package as a whole.

(2) The die attach step used in a conventional die-up BGA package assembly process is not needed. Because of this, potential reliability issues associated with the die attach interface for conventional IC packages, such as both BGA and leadframe types, are removed. For example, an undesirable "popcorn phenomenon" may be conventionally caused by moisture absorption at room temperature and cracking at elevated temperature during a reflow surface mounting process, to release the build up of vapor pressure. The popcorn phenomenon may also conventionally occur where there exists insufficient die attach epoxy coverage underneath the die that could trap moisture as well as other foreign materials underneath the die. It is commonly known that die attach epoxy and organic substrates that are widely used for IC package assembly are hygroscopic. Moisture in the atmosphere is readily absorbed by both. The absorbed moisture penetrates into the die attach interface between the IC die and the substrate. When exposed to elevated temperature during reflow soldering, the absorbed moisture expands and creates high pressure at the die attach interface. If there is enough moisture, the die attach interface can crack and sometimes emit acoustic sounds like the popping of popcorn. The popcorn phenomenon may be avoided in embodiments by using metal or metal alloy for soldering the IC die and other components of an example package instead of die attach epoxy or organic substrates.

(3) There is no direct contact between the peripheral edges of the IC die and the inside walls of the central window opening of the substrate. Instead a gap is present. The gaps are filled with an encapsulating material such as a molding compound that provides a buffer zone for thermal and mechanical stress interactions during manufacturing and applications between the IC die and the substrate. Package assembly, manufacturing yields and field application reliability can be improved due to the removal of the conventional contact interface between the IC die and the substrate.

(4) An encapsulating material covers the top surface of the substrate and may partially cover the bottom surface along the periphery of the substrate's opening. This structure provides a tight locking mechanism between the substrate and the encapsulating material after solidifying (e.g. mold cure). Bonding strength between the encapsulating material and the substrate is improved over the conventional mold structure, where the encapsulating material covers the top surface of the flat substrate only. Mechanical stresses are applied during the package singulation process. Conventionally, mold delamination occurs due to mechanical stresses applied on the substrate, the mold, or both. Improved bonding between the mold and the substrate reduces mold delamination at the mold/substrate interfaces and improves production yield.

(5) Direct soldering of the exposed die to the circuit board for die-up wirebond packages improves package heat dissipation capability and provides an electrical interconnection from the backside of the IC die to the board. Package junction-to-board thermal resistance is substantially reduced using direct soldering of the IC die to application board during the surface mount process. The land area of the exposed die can be deposited with solder paste during the same process step. The backside of the IC can be used as a ground or power plane connecting to the ground or power rails using through-wafer-vias. Due to a short electrical path from the front side of the IC die to the ground or power plane on the circuit board, the impedance to current flow can be substantially reduced and power delivery to IC circuits improved.

(6) Mini solder balls attached to the exposed backside of the IC die can have a different size and ball pitch from the solder balls attached to the package substrate surrounding the mini solder balls.

(7) Packages can use conventional types of substrate (i.e. organic, tape, ceramic, etc.) as well as advanced types of substrate (high density substrate, build-up substrate, Teflon substrate, etc.). A single routing layer substrate or a two or more layer substrate can be used.

(8) Various processes for die encapsulation can be used, including dam-and-fill (glob top), injection molding (overmold, saw-singulated molding), among others, to meet the requirement of various applications and provide packages with various forms and appearances.

(9) A film lamination process may be used to recess the die for direct system board contact. A simple heat dissipation interface between the device and the system board is provided.

CONCLUSION

While various embodiments of the present invention have been described above, it should be understood that they have been presented by way of example only, and not limitation. It should be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

What is claimed is:

1. A die-up exposed die integrated circuit (IC) package comprising:
    a substrate having opposing first and second surfaces, wherein a plurality of contact pads on the first surface of the substrate are electrically connected to a plurality of bond pads on the second surface of the substrate, wherein the substrate further has a central opening that is open at the first and second surfaces of the substrate;
    an IC die having opposing first and second surfaces, wherein the IC die is located in the central opening, wherein the second surface of the IC die is configured to be coupled to a printed circuit board (PCB), and wherein the IC package is configured to be mounted to the PCB;
    at least one wirebond that couples at least one bond pad on the first surface of the IC die to at least one bond pad on the second surface of the substrate; and
    an encapsulating material that encapsulates the IC die and at least one wirebonds such that the second surface of the IC die is exposed, wherein the encapsulating material suspends the IC die in the opening.

2. The package of claim 1, wherein the plurality of contact pads is a plurality of solder ball pads, further comprising: a plurality of solder balls coupled to the solder ball pads.

3. The package of claim 1, further comprising: a plurality of conductive pins coupled to the plurality of contact pads on the first surface of the substrate.

4. The package of claim 1, wherein a second plurality of contact pads is present on the second surface of the IC die, further comprising: a plurality of solder balls attached to the second plurality of contact pads, wherein the plurality of solder balls is configured to directly contact the PCB.

5. The package of claim 1, wherein a second plurality of contact pads is present on the second surface of the IC die, further comprising: a first plurality of solder balls attached to the second plurality of contact pads, wherein a diameter of the first plurality of solder balls is less than a diameter of a second plurality of solder balls attached to the first plurality of contact pads.

6. The package of claim 1, wherein a portion of a third surface of the IC die is exposed.

7. The package of claim 1, wherein the IC die is entirely covered by the encapsulating material except that the second surface of the IC die is exposed.

8. The package of claim 1, wherein the encapsulating material covers a portion of the first surface of the substrate.

9. The package of claim 1, wherein the substrate is a flex tape substrate.

10. The package of claim 1, wherein the substrate is a ceramic substrate.

11. The package of claim 1, wherein the substrate comprises FR4.

12. The package of claim 1, wherein a metallization layer is formed on the second surface of the IC die.

13. The package of claim 1, wherein a distance between the second surface of the IC die and the PCB is smaller than a distance between the second surface of the substrate and the PCB.

14. The package of claim 13, wherein a surface of the encapsulation material is coplanar with the second surface of the IC die.

* * * * *